(12) United States Patent
Klein (10) Patent No.: US 7,909,581 B2
(45) Date of Patent: Mar. 22, 2011

(54) LAYER SYSTEM, USE AND PROCESS FOR PRODUCING A LAYER SYSTEM

(75) Inventor: Karsten Klein, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 942 days.

(21) Appl. No.: 11/792,656

(22) PCT Filed: Sep. 27, 2005

(86) PCT No.: PCT/EP2005/054842

§ 371 (c)(1),
(2), (4) Date: Jun. 8, 2007

(87) PCT Pub. No.: WO2006/061267

PCT Pub. Date: Jun. 15, 2006

(65) Prior Publication Data

US 2008/0226871 A1 Sep. 18, 2008

(30) Foreign Application Priority Data

Dec. 8, 2004 (EP) .................................... 04029079

(51) Int. Cl.
*F01D 5/18* (2006.01)
*B32B 3/10* (2006.01)
*F01D 5/28* (2006.01)

(52) U.S. Cl. .................................................. 416/241 B

(58) Field of Classification Search .................. 415/115; 416/96 R, 97 R, 241 R, 241 B See application file for complete search history.

(56) References Cited

U.S. PATENT DOCUMENTS

| | | | |
|---|---|---|---|
| 5,269,653 A | 12/1993 | Evans et al. | |
| 6,024,792 A | 2/2000 | Kurz et al. | |
| 6,039,537 A | 3/2000 | Scheurlen | |
| 6,761,956 B2 * | 7/2004 | Lee et al. | 428/131 |
| 2003/0118444 A1 * | 6/2003 | Lee et al. | 416/97 R |

FOREIGN PATENT DOCUMENTS

| | | |
|---|---|---|
| DE | 38 21 005 A1 | 12/1989 |
| EP | 0 412 397 A1 | 2/1991 |
| EP | 0 486 489 B1 | 5/1992 |
| EP | 0 510 740 A1 | 10/1992 |
| EP | 0 668 368 A1 | 8/1995 |
| EP | 0 786 017 B1 | 7/1997 |
| EP | 0 892 090 A1 | 1/1999 |
| EP | 1 076 107 A1 | 2/2001 |
| EP | 1 204 776 B1 | 5/2002 |
| EP | 1 306 454 A1 | 5/2003 |
| EP | 1 318 273 A2 | 6/2003 |
| EP | 1 319 729 A1 | 6/2003 |
| EP | 1 375 825 A1 | 2/2004 |
| JP | 62017307 A * | 1/1987 |
| JP | 3306760 B2 | 7/2002 |
| WO | WO 99/67435 A1 | 12/1999 |
| WO | WO 00/44949 A1 | 8/2000 |

* cited by examiner

*Primary Examiner* — Edward Look
*Assistant Examiner* — Jesse Prager (57) ABSTRACT

Layered systems, which are used at high temperatures, often degrade rapidly when a layer has been lost, leading to the damage or loss of the component that consists of said layered system. A described layered system comprises at least one cooling safety orifice, which is e.g. covered by an intermediate layer and an outer layer. The cooling safety orifice opens if the layers are damaged, in such a way that the layered system is additionally cooled by a coolant that flows through the cooling safety orifice.

4 Claims, 8 Drawing Sheets

LAYER SYSTEM, USE AND PROCESS FOR PRODUCING A LAYER SYSTEM

CROSS REFERENCE TO RELATED APPLICATIONS

This application is the U.S. National Stage of International Application No. PCT/EP2005/054842, filed Sep. 27, 2005 and claims the benefit thereof. The International Application claims the benefits of European application No. 04029079.3 EP filed Dec. 8, 2004, both of the applications are incorporated by reference herein in their entirety.

FIELD OF INVENTION

The invention relates to a layer system and a method to produce a layer system.

BACKGROUND OF INVENTION

Components which are used at high temperatures often have protective layers protecting the component against corrosion or excessive introduction of heat.

However, the layer may flake off or degrade while the component is in use, with the result that the desired protection function can no longer be provided. This leads to damage to the substrate and sometimes to component failure. In the event of damage to the substrate, it may no longer be possible to refurbish the component, i.e. to recoat it with a new layer.

EP 1 318 273 A2, EP 1 375 825 A1 and U.S. Pat. No. 6,039,537 disclose a turbine blade or vane in which a film cooling hole is closed by a single layer. EP 1 318 273 A2 also describes the presence of a plug in the film cooling hole even after coating.

SUMMARY OF INVENTION

Therefore, an object of the invention is to provide a layer system, a use of a layer system and processes for producing a layer system which overcomes the problem.

The object is achieved by the layer system as claimed in a first independent claim. The layer system has at least one safety cooling hole, which is closed A processes for producing a layer system is claimed in a further independent claim.

When the layer flakes off in the region of a safety cooling hole, this cooling hole is opened and the layer system is cooled in this region, so that there is little if any damage under the operating conditions to which the layer system is exposed.

The subclaims list further advantageous measures, which can advantageously be combined with one another in any desired way.

BRIEF DESCRIPTION OF THE DRAWINGS

In the drawing, in exert and diagrammatic form.

DETAILED DESCRIPTION OF INVENTION

The layer system 1 may be a component of a turbine, in particular a turbine blade or vane 120, 130 (FIG. 12) or a heat shield element 155 (FIG. 13) of a gas turbine 100 (FIG. 14) or steam turbine.

The layer system 1 (FIGS. 1 to 5) has a substrate 4, which in the case of components used at high temperatures, in particular turbine components 120, 130, 155, consists of a nickel-, cobalt- or iron-base superalloy.

Figure 1:
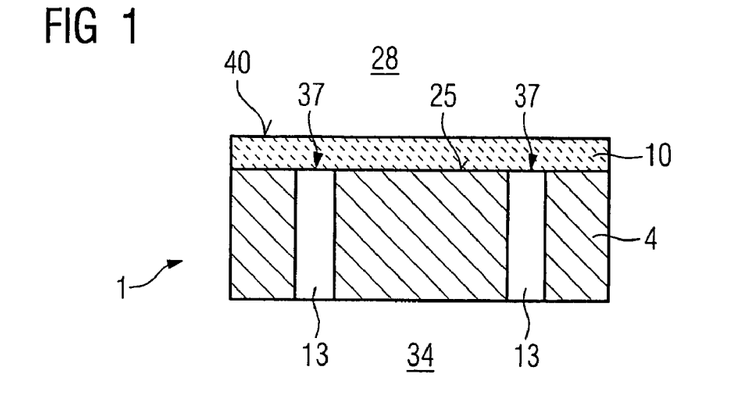
FIGS. 1 to 5 show exemplary embodiments of a layer system.

FIG. 1 shows an example of a layer system 1 according to the invention:

In the substrate 4 there is at least one safety cooling hole 13 which, for example, extends as far as an outer surface 25 of the substrate 4 which is closest to an external medium, for example a hot gas 28. However, the safety cooling holes 13 are deliberately covered by an outer layer 10, for example a MCrAlX layer, i.e. the openings 37 in the safety cooling hole 13 are closed by this outer layer 10, with the result that cooling medium from a cooling reservoir 34 does not penetrate to the outside 28 through a safety cooling hole 13.

Figure 2:
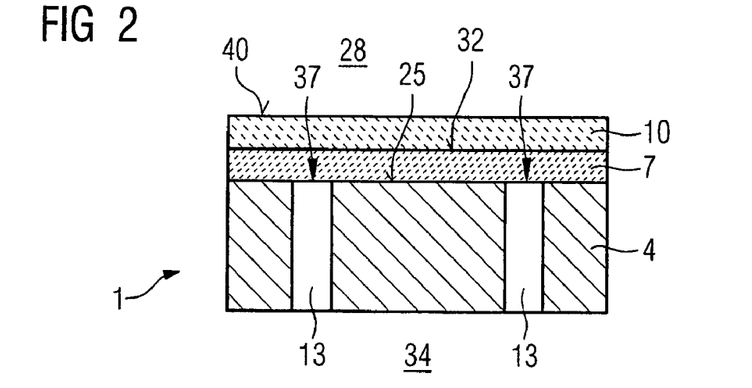
Figure 3:
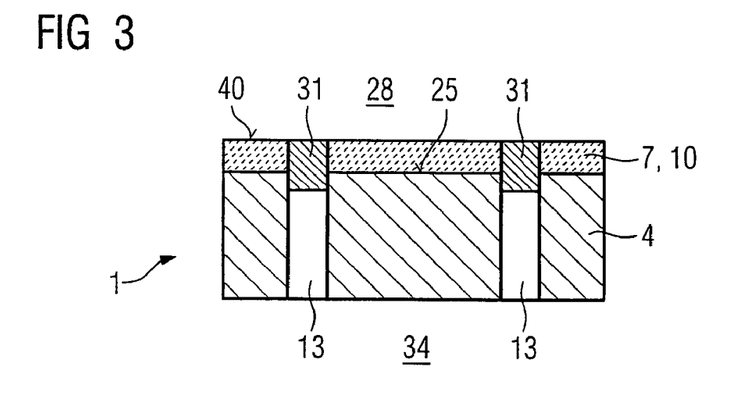

It is also possible for at least one further intermediate layer 7 to be present beneath the layer 10, so that the safety cooling holes 13 are covered for example by two layers 7 (MCrAlX), 10 (ceramic thermal barrier coating) (FIG. 2).

However, the intermediate layer 7 may also be a ceramic layer (e.g. aluminum oxide).

In these exemplary embodiments (FIGS. 1, 2), all the safety cooling holes 13 are covered.

The safety cooling holes 13 can be closed by a layer 7, 10 or by a pin 31 (FIG. 3) which extends into the layer 7, 10 and/or into the substrate 4. This pin 31 may be solid and/or fitted in or is produced for example by a slurry which is introduced into the cooling hole and hardened (sintered).

Figure 4:
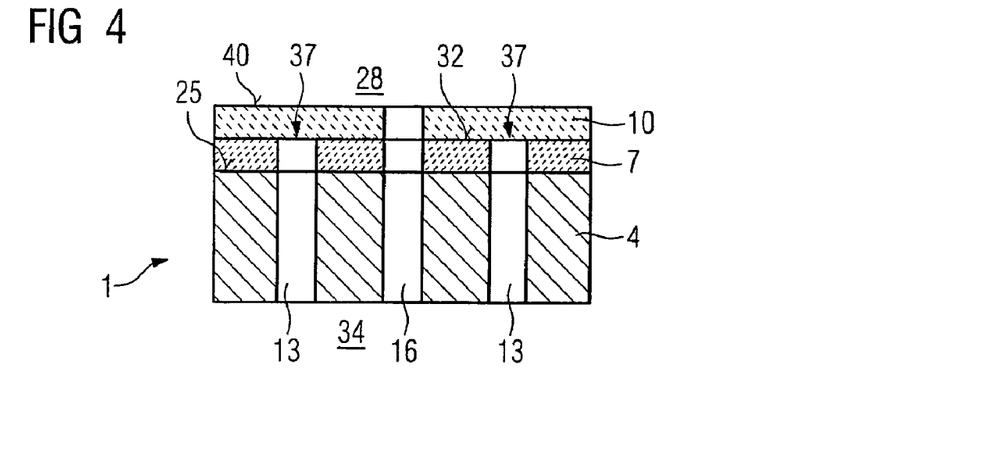

FIG. 4 shows a further exemplary embodiment of a layer system 1 according to the invention.

In this case, the layer system 1 has an intermediate layer 7 and a further, outer layer 10. The intermediate layer 7 is, for example, a MCrAlX layer, on which for example a ceramic thermal barrier coating 10 is arranged.

Figure 5:
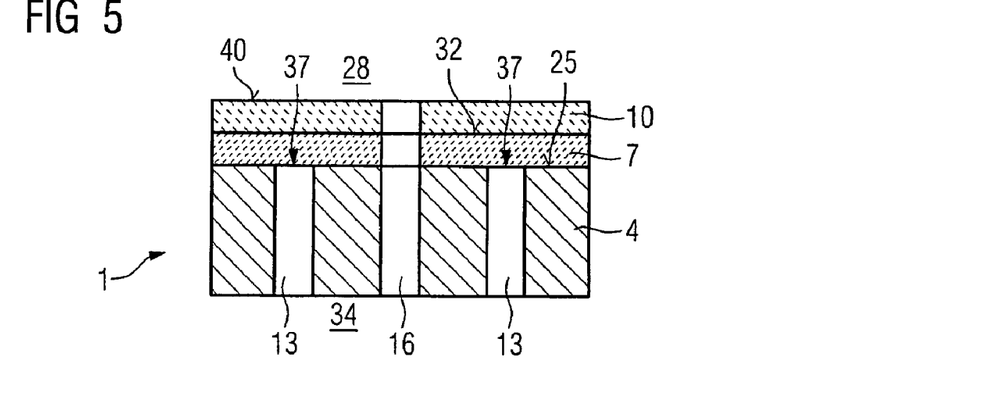

The safety cooling holes 13, which are covered only by an outer layer 10, in this case extend within the substrate 4 and through the intermediate layer 7, i.e. they adjoin an interface 32 between layer 7 and layer 10. It is also possible for the covered safety cooling holes 13 to extend only as far as the surface 25 of the substrate 4 (FIG. 5).

The layer system 1 (FIGS. 4, 5) may but need not necessarily have at least one cooling hole 16 that is open, i.e. constitutes a passage hole, through which, in normal operation, a cooling medium, for example cooling air from a cooling reservoir, flows.

Figure 6:
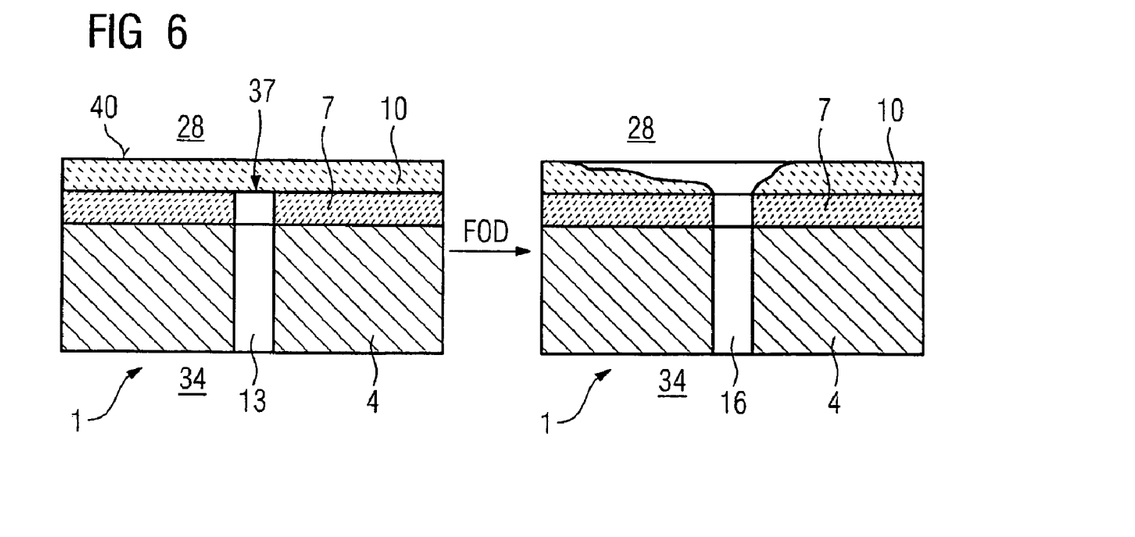
FIG. 6 diagrammatically depicts the way in which the safety cooling holes operate.

FIG. 6 shows the way in which the covered safety cooling holes 13 operate.

A hot medium 28 is adjacent to the outer surface of the outer layer 10.

The layer 10 flakes off in a locally limited fashion as a result of the impingement of foreign particles (foreign object damage, FOD) or as a result of degradation of the layers 7, 10 covering the safety cooling hole, in this case the layer 10, after which the safety cooling hole 13 is then opened or a pin 31 (FIG. 3) can no longer maintain its closure action. Since the safety cooling hole 13 is likewise adjacent to a reservoir 34 of a cooling medium, the cooling medium then flows through the safety cooling hole 13, which now constitutes a cooling hole 16.

The covered safety cooling holes 13 are arranged at locations where, when the component 1 is in operation, no additional or further film cooling is required on account of the presence of the thermal barrier coating 10. By contrast, local disruption of the ceramic thermal barrier coating 10 would lead to increased, unacceptable rises in temperature of the substrate 4.

However, this is prevented by the additional cooling of the opened safety cooling hole 13, with the result that the substrate 4 is not subject to any unacceptable level of damage and/or can be reused.

The consumption of cooling medium, which is slightly increased a as result of safety cooling holes 13 being opened up and leads to a slight reduction in efficiency, is more than compensated for by the advantage of the expensive substrate 4 not being damaged.

Figure 7:
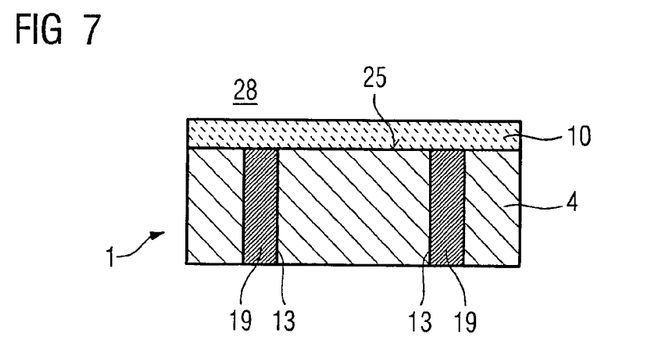
FIGS. 7 to 11 show process steps involved in the production of a layer system according to the invention.

FIG. 7 shows, by way of example, how a layer system 1 according to the invention can be produced.

Holes (passage holes), which are intended to form safety cooling holes 13 and optionally further cooling holes 16 which are to be used during normal operation of the substrate 4, are introduced into the substrate 4.

Depending on the coating process, a hole may (but need not) be filled with a masking agent 19 which prevents the material of the layer 10 from penetrating into and blocking the hole.

The masking agent 19 only has to withstand the coating temperatures used to coat the layer 10, and thereafter can be removed, for example by evaporation or leaching. If appropriate, a further layer is also applied.

Figure 8:
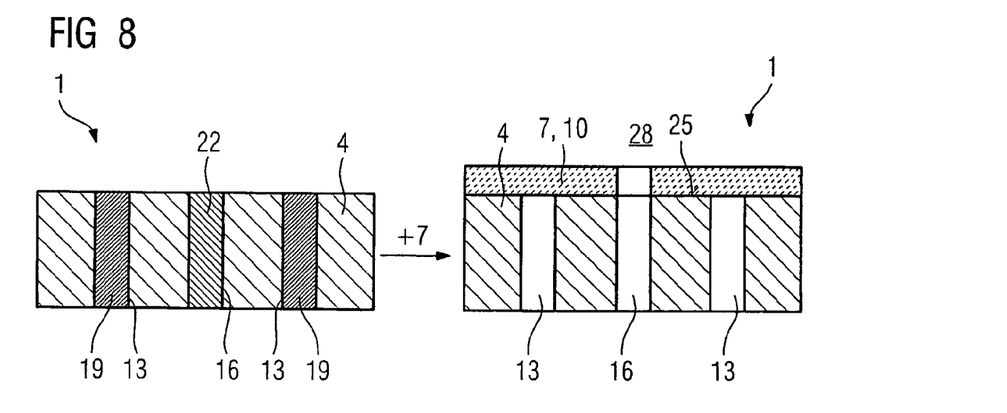

FIG. 8 shows another possible option for producing the layer system 1 according to the invention.

The layer system 1 has safety cooling holes 13, which are covered, and at least one cooling hole 16, which remains open.

A masking agent 19, on or over which the material of the layer 7, 10 that is to be applied can be deposited, is introduced into the holes for the safety cooling holes 13 that are to be produced.

By contrast, by way of example a nonstick masking agent 22, on which the material of the coating 7, 10 is not deposited (right-hand part of FIG. 8), is introduced into a hole 16 that is to remain open, thereby forming a cooling hole 16.

Figure 9:
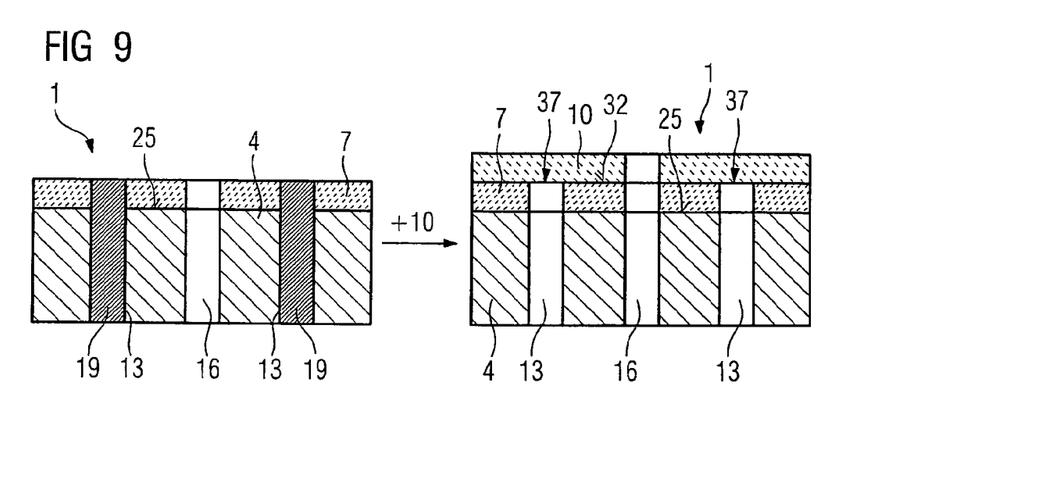

FIG. 9 shows a further variant for producing a layer system 1 according to the invention.

Here, by way of example, the substrate 4 with the coating 7 were produced by a nonstick masking agent 22 being introduced into all the safety cooling holes 13 and cooling holes 16 that are to be produced, or by the substrate 4 being coated with the layer 7 and then holes being introduced into the layer 7 and into the substrate 4 in the region of the safety cooling holes 13 and cooling holes 16 that are to be produced.

Thereafter, the safety cooling holes 13 that are to be produced are filled with a masking agent 19 (FIG. 9), whereas the cooling hole 16 that is to be produced is not filled with a masking agent or is filled with a nonstick masking agent 22.

During the application of the outer layer 10, the holes are covered and, in the desired way, form safety cooling holes 13, while a hole remains open as a cooling hole 16.

It is also possible for the cooling holes 16 that remain open to be covered and to be opened up again by removal of material, for example by laser beams or electron beams, above the cooling holes 16 that are to remain open.

Figure 10:
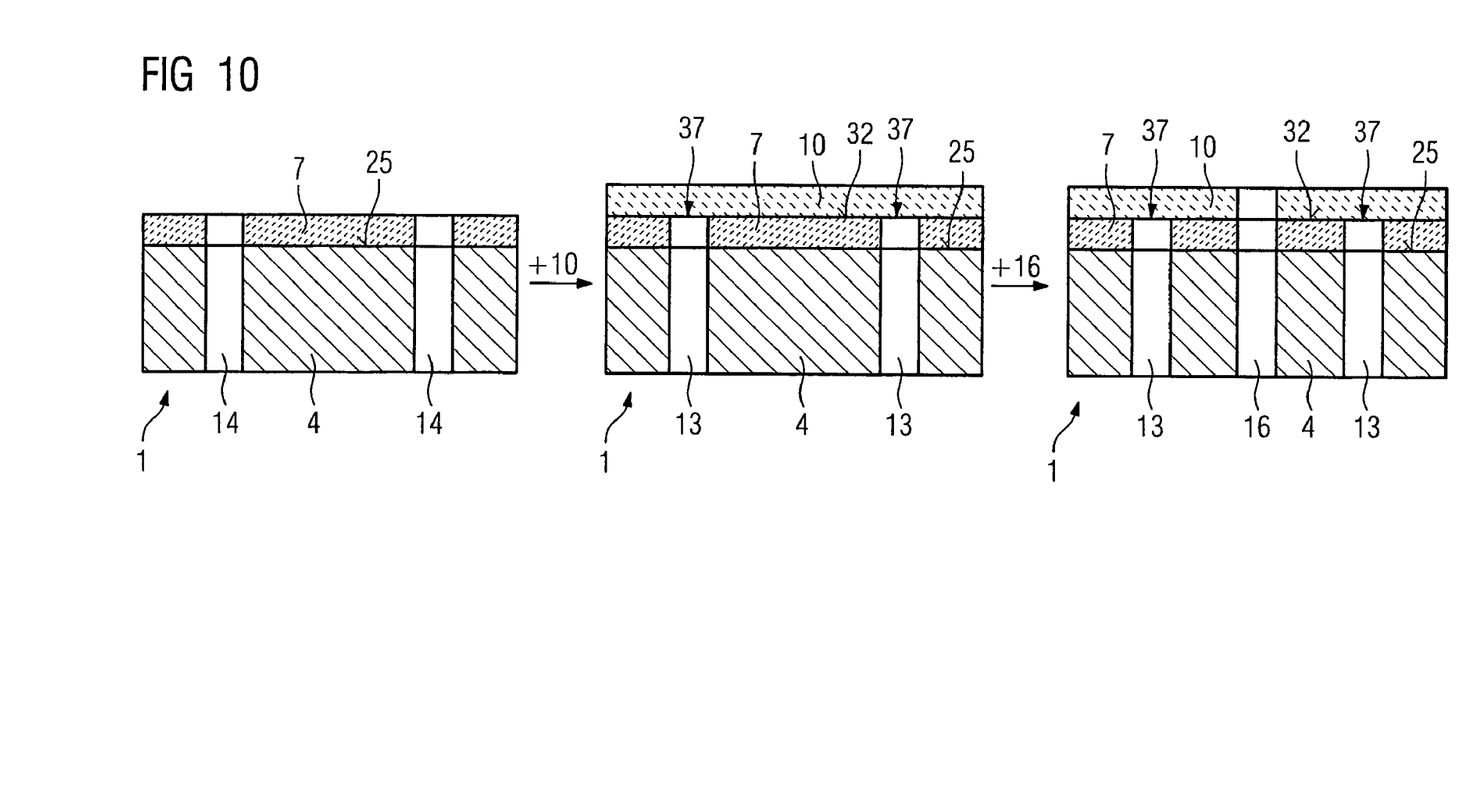

FIG. 10 shows another possible form of a layer system 1 according to the invention.

In this case, in a first process step, a substrate 4 is coated with a layer 7, with passage holes 14 then being produced through the layer 7 and the substrate 4. It is also possible for passage holes 14 to be produced in the substrate 4 before it is coated with the layer 7, in which case no material is applied above the passage holes 14 during the coating of the layer 7, with the result that the passage hole 14 extends through the layer 7 even after the substrate 4 has been coated with the layer 7.

In a further process step, a further layer, for example an outer layer 10, which then covers the passage holes 14, is applied; in this case, by way of example, passage holes 14 were filled with masking agent 14, or alternatively a gas flows out of the passage holes during the coating operation, in order thereby to form safety cooling holes 13.

In particular when using the EB-PVD process, there is no need to use any masking agent.

In one of the last process steps, the continuous film cooling hole 16 is then introduced into the layer 7, 10 and the substrate 4.

The process can be correspondingly employed if only a single outer layer 10 is to be present on a substrate 4, i.e. passage holes 14 are produced in the substrate 4 and the single layer 10 is applied, covering the passage holes 14 in the substrate 4, after which at least one passage hole 14 is introduced into the single outer layer and the substrate 4.

Figure 11:
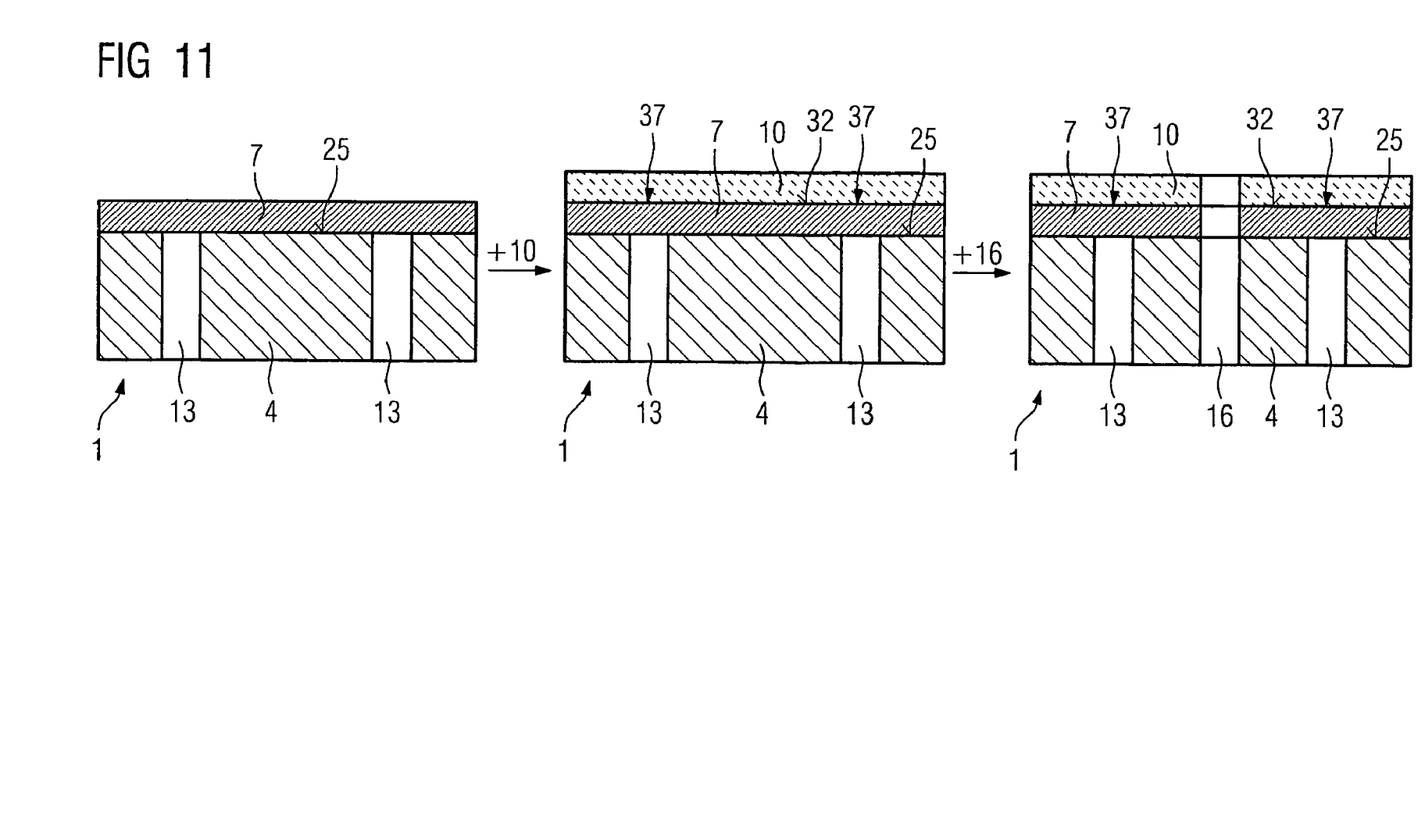

FIG. 11 shows another possible form of a layer system 1 according to the invention.

In this case, in a first process step passage holes 14 are produced in the substrate 4 (not shown).

In a further process step, a layer 7 is applied to the substrate 4, covering the passage holes 14, so as to form safety cooling holes 13. In a second step, the layer 10, for example an outer ceramic layer, is applied.

In a final step, the layer 7, 10 and the substrate 4 are provided with a continuous film cooling hole 16. The process has the advantage that in this case the outer ceramic layer is arranged on the bonding layer 7, resulting in secure bonding of the outer ceramic layer.

Figure 12:
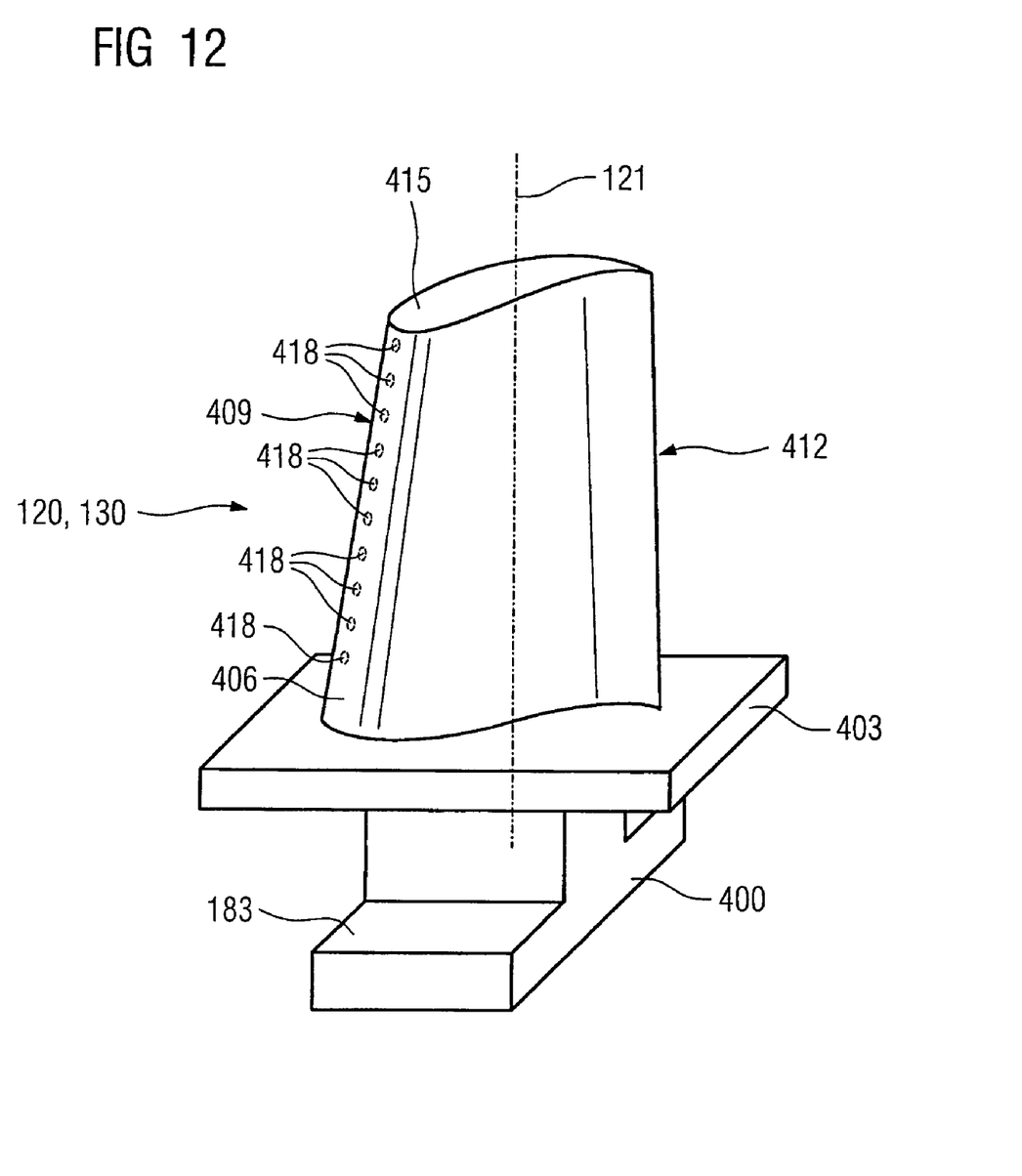
FIG. 12 shows a turbine blade or vane.

FIG. 12 shows a perspective view of a rotor blade 120 or guide vane 130 of a turbomachine, which extends along a longitudinal axis 121.

The turbomachine may be a gas turbine of an aircraft or of a power plant for generating electricity, a steam turbine or a compressor.

The blade or vane 120, 130 has, in succession along the longitudinal axis 121, a securing region 400, an adjoining blade or vane platform 403 and a main blade or vane part 406.

As a guide vane 130, the vane 130 may have a further platform (not shown) at its vane tip 415.

A blade or vane root 183, which is used to secure the rotor blades 120, 130 to a shaft or a disk (not shown), is formed in the securing region 400.

The blade or vane root 183 is designed, for example, in hammerhead form. Other configurations, such as a fir-tree or dovetail root, are possible.

The blade or vane 120, 130 has a leading edge 409 and a trailing edge 412 for a medium which flows past the main blade or vane part 406.

In the case of conventional blades or vanes 120, 130, by way of example solid metallic materials, in particular superalloys, are used in all regions 400, 403, 406 of the blade or vane 120, 130.

Superalloys of this type are known, for example, from EP 1 204 776 B1, EP 1 306 454, EP 1 319 729 A1, WO 99/67435 or WO 00/44949; these documents are incorporated by reference herein in their entirety. The blade or vane 120, 130 may in this case be produced by a casting process, also by means of directional solidification, by a forging process, by a milling process or combinations thereof.

Workpieces with a single-crystal structure or structures are used as components for machines which, in operation, are exposed to high mechanical, thermal and/or chemical stresses.

Single-crystal workpieces of this type are produced, for example, by directional solidification from the melt. This involves casting processes in which the liquid metallic alloy solidifies to form the single-crystal structure, i.e. the single-crystal workpiece, or solidifies directionally.

In this case, dendritic crystals are oriented along the direction of heat flow and form either a columnar crystalline grain structure (i.e. grains which run over the entire length of the workpiece and are referred to here, in accordance with the language customarily used, as directionally solidified) or a single-crystal structure, i.e. the entire workpiece consists of one single crystal. In these processes, a transition to globular (polycrystalline) solidification needs to be avoided, since non-directional growth inevitably forms transverse and longitudinal grain boundaries, which negate the favorable properties of the directionally solidified or single-crystal component.

Where the text refers in general terms to directionally solidified microstructures, this is to be understood as meaning both single crystals, which do not have any grain boundaries or at most have small-angle grain boundaries, and columnar crystal structures, which do have grain boundaries running in the longitudinal direction but do not have any transverse grain boundaries. This second form of crystalline structures is also described as directionally solidified microstructures (directionally solidified structures).

Processes of this type are known from U.S. Pat. No. 6,024,792 and EP 0 892 090 A1; these documents are incorporated by reference herein in their entirety.

The blades or vanes 120, 130 may likewise have coatings (as part of the layer system according to the invention) protecting against corrosion or oxidation (e.g. MCrAlX; M is at least one element selected from the group consisting of iron (Fe), cobalt (Co), nickel (Ni), X is an active element and represents yttrium (Y) and/or silicon and/or at least one rare earth element, or hafnium (Hf)). Alloys of this type are known from EP 0 486 489 B1, EP 0 786 017 B1, EP 0 412 397 B1 or EP 1 306 454 A1, which are incorporated by reference herein in their entirety.

It is also possible for a thermal barrier coating, consisting for example of $ZrO_2$, $Y_2O_4$—$ZrO_2$, i.e. unstabilized, partially stabilized or fully stabilized by yttrium oxide and/or calcium oxide and/or magnesium oxide, to be present on the MCrAlX.

Columnar grains are produced in the thermal barrier coating by means of suitable coating processes, such as for example electron beam physical vapor deposition (EB-PVD).

Refurbishment means that after they have been used, protective layers may have to be removed from components 120, 130 (e.g. by sand-blasting). Then, the corrosion and/or oxidation layers and products are removed. If appropriate, cracks in the component 120, 130 are also repaired. This is followed by recoating of the component 120, 130, after which the component 120, 130 can be reused.

The blade or vane 120, 130 may be hollow or solid in form. If the blade or vane 120, 130 is to be cooled, it is hollow and may also have film-cooling holes 418 (indicated by dashed lines) and safety cooling holes 13.

Figure 13:
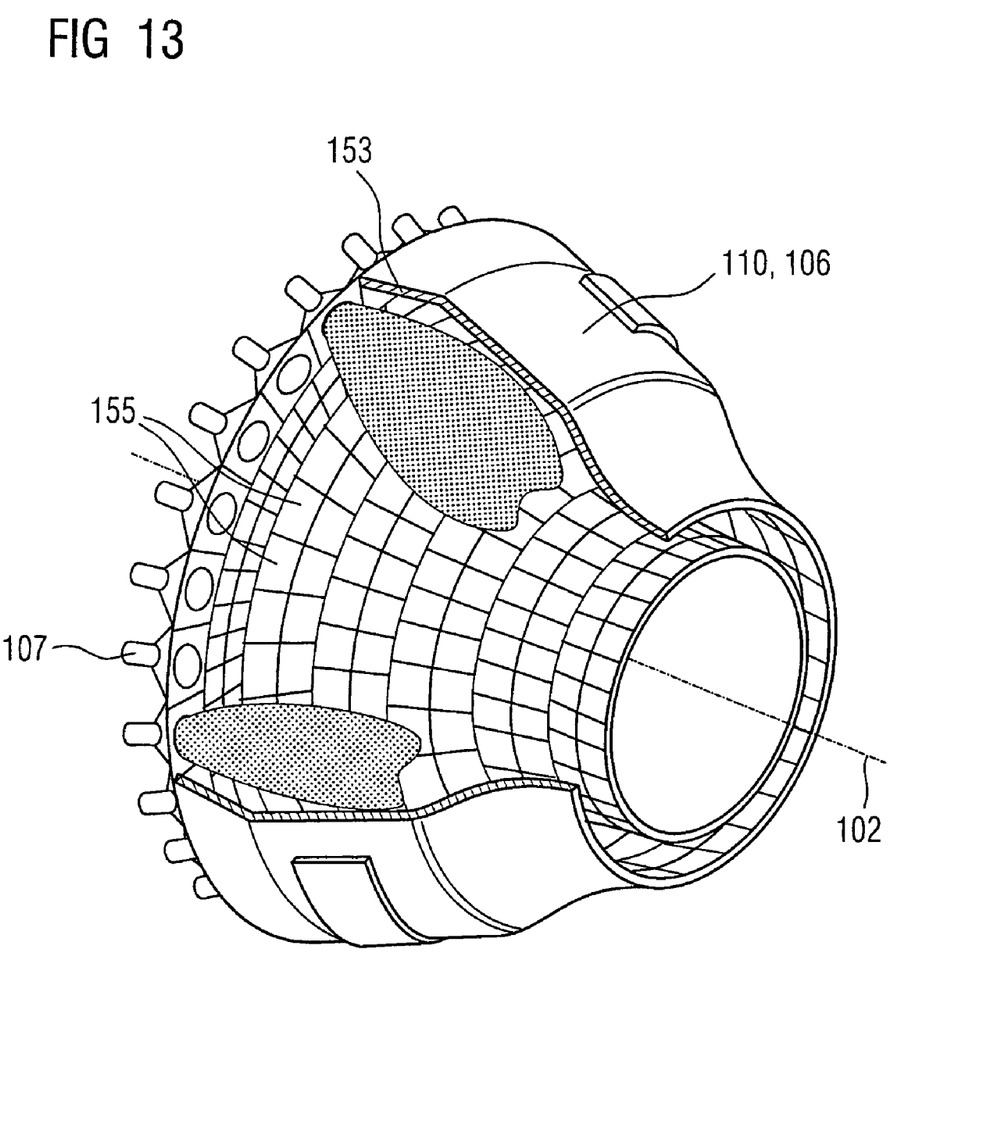
FIG. 13 shows a combustion chamber.

FIG. 13 shows a combustion chamber 110 of a gas turbine 100. The combustion chamber 110 is configured, for example, as what is known as an annular combustion chamber, in which a multiplicity of burners 107 arranged circumferentially around the axis of rotation 102 open out into a common combustion chamber space. For this purpose, the combustion chamber 110 overall is of annular configuration positioned around the axis of rotation 102.

To achieve a relatively high efficiency, the combustion chamber 110 is designed for a relatively high temperature of the working medium M of approximately 1000° C. to 1600° C. To allow a relatively long service life even with these operating parameters, which are unfavorable for the materials, the combustion chamber wall 153 is provided, on its side which faces the working medium M, with an inner lining formed from heat shield elements 155.

On the working medium side, each heat shield element 155 is equipped with a particularly heat-resistant protective layer (for example as part of a layer system according to the invention) or is made from material that is able to withstand high temperatures.

These may be solid ceramic bricks or alloys with MCrAlX and/or ceramic coatings.

The materials of the combustion chamber wall and their coatings may be similar to the turbine blades or vanes.

On account of the high temperatures in the interior of the combustion chamber 110, it is also possible for a cooling system to be provided for the heat shield elements 155 and/or their holding elements, or for the arrangement with the heat shield elements 155 and/or for the heat shield elements 155 themselves to have, for example, cooling holes 16 and safety cooling holes 13.

Figure 14:
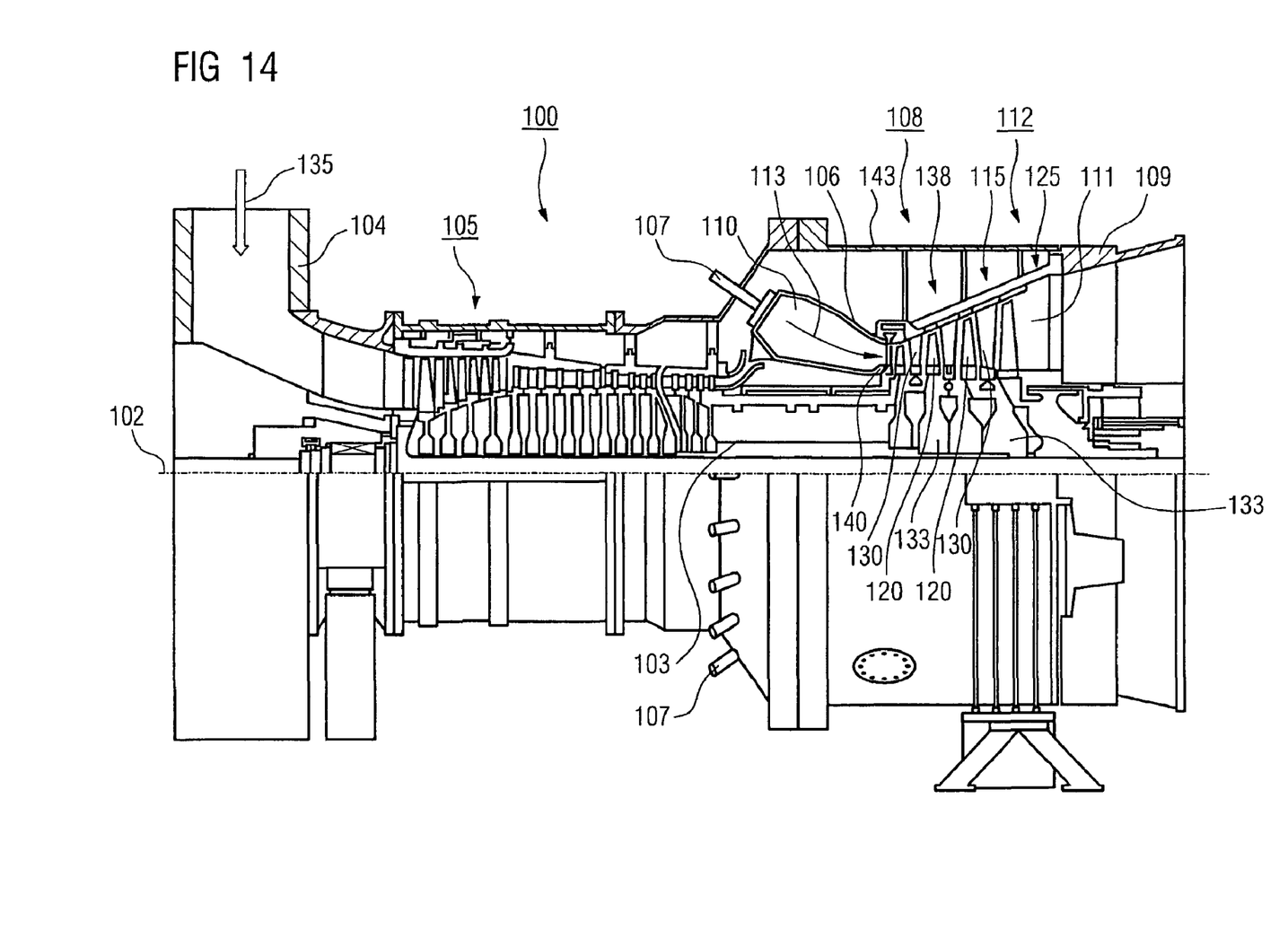
FIG. 14 shows a gas turbine.

FIG. 14 shows, by way of example, a partial longitudinal section through a gas turbine 100.

In the interior, the gas turbine 100 has a rotor 103 which is mounted such that it can rotate about an axis of rotation 102 and is also referred to as the turbine rotor.

An intake housing 104, a compressor 105, a, for example, toroidal combustion chamber 110, in particular an annular combustion chamber 106, with a plurality of coaxially arranged burners 107, a turbine 108 and the exhaust-gas housing 109 follow one another along the rotor 103.

The annular combustion chamber 106 is in communication with a, for example, annular hot-gas passage 111, where, by way of example, four successive turbine stages 112 form the turbine 108.

Each turbine stage 112 is formed, for example, from two blade or vane rings. As seen in the direction of flow of a working medium 113, in the hot-gas passage 111 a row of guide vanes 115 is followed by a row 125 formed from rotor blades 120.

The guide vanes 130 are secured to an inner housing 138 of a stator 143, whereas the rotor blades 120 of a row 125 are fitted to the rotor 103 for example by means of a turbine disk 133.

A generator (not shown) is coupled to the rotor 103.

While the gas turbine 100 is operating, the compressor 105 sucks in air 135 through the intake housing 104 and compresses it. The compressed air provided at the turbine-side end of the compressor 105 is passed to the burners 107, where it is mixed with a fuel. The mix is then burnt in the combustion chamber 110, forming the working medium 113. From there, the working medium 113 flows along the hot-gas passage 111 past the guide vanes 130 and the rotor blades 120. The working medium 113 is expanded at the rotor blades 120, transferring its momentum, so that the rotor blades 120 drive the rotor 103 and the latter in turn drives the generator coupled to it.

While the gas turbine 100 is operating, the components which are exposed to the hot working medium 113 are subject to thermal stresses. The guide vanes 130 and rotor blades 120 of the first turbine stage 112, as seen in the direction of flow of the working medium 113, together with the heat shield bricks which line the annular combustion chamber 106, are subject to the highest thermal stresses.

To be able to withstand the temperatures which prevail there, they have to be cooled by means of a coolant.

Substrates of the components may likewise have a directional structure, i.e. they are in single-crystal form (SX structure) or have only longitudinally oriented grains (DS structure).

By way of example, iron-base, nickel-base or cobalt-base superalloys are used as material for the components, in particular for the turbine blade or vane 120, 130 and components of the combustion chamber 110.

Superalloys of this type are known, for example, from EP 1 204 776 B1, EP 1 306 454, EP 1 319 729 A1, WO 99/67435 or WO 00/44949; these documents are incorporated by reference herein in their entirety.

The blades or vanes 120, 130 may also have coatings which protect against corrosion (MCrAlX; M is at least one element selected from the group consisting of iron (Fe), cobalt (Co), nickel (Ni), X is an active element and represents yttrium (Y) and/or silicon and/or at least one rare earth element or hafnium). Alloys of this type are known from EP 0 486 489 B1, EP 0 786 017 B1, EP 0 412 397 B1 or EP 1 306 454 A1, these documents are incorporated by reference herein in their entirety.

A thermal barrier coating, consisting for example of $ZrO_2$, $Y_2O_3$—$ZrO_2$, i.e. unstabilized, partially stabilized or completely stabilized by yttrium oxide and/or calcium oxide and/or magnesium oxide, may also be present on the MCrAlX. Columnar grains are produced in the thermal barrier coating by suitable coating processes, such as for example electron beam physical vapor deposition (EB-PVD).

The guide vane 130 has a guide vane root (not shown here), which faces the inner housing 138 of the turbine 108, and a guide vane head which is at the opposite end from the guide vane root. The guide vane head faces the rotor 103 and is fixed to a securing ring 140 of the stator 143.

The invention claimed is:

1. A method for producing a layer system, comprising:
    introducing a masking agent in a first plurality of safety cooling holes,
        wherein the first plurality of safety cooling holes are in a substrate or in the substrate and an intermediate layer, and
        wherein the intermediate layer is deposited on or over the masking agent;
    introducing a nonstick masking agent into a second plurality of safety holes in order to prevent the intermediate layer from being deposited over the nonstick masking agent;
    applying the intermediate layer to a surface of a device with the substrate and the first plurality of safety cooling holes, wherein the intermediate layer is applied over the filled first plurality of safety cooling holes to cover the first plurality of safety cooling holes; and
    removing the masking agent and the non-stick masking agent after the coating, wherein the applied intermediate layer stays to close the first plurality of safety cooling holes.

2. The method as claimed in claim 1, wherein the device is an airfoil, and wherein the airfoil is selected from the group consisting of a turbine blade and a vane.

3. The method as claimed in claim 1,
    wherein the safety cooling holes extend through the substrate and the intermediate layer,
    wherein the nonstick masking agent is introduced into a cooling hole that remains open, and
    wherein a further layer is applied to the intermediate layer to cover the safety cooling holes.

4. The method as claimed in claim 3, wherein the further layer is an outer layer of the device.

* * * * *